(12) United States Patent
Gomm

(10) Patent No.: US 6,759,883 B2
(45) Date of Patent: Jul. 6, 2004

(54) VARIABLE DELAY CIRCUIT AND METHOD, AND DELAY LOCKED LOOP, MEMORY DEVICE AND COMPUTER SYSTEM USING SAME

(75) Inventor: Tyler J. Gomm, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/272,279

(22) Filed: Oct. 15, 2002

(65) Prior Publication Data

US 2003/0042961 A1 Mar. 6, 2003

Related U.S. Application Data

(62) Division of application No. 09/943,779, filed on Aug. 29, 2001.

(51) Int. Cl.[7] ............................................. H03H 11/26
(52) U.S. Cl. ..................................... 327/276; 713/401
(58) Field of Search ................................ 327/149, 150, 327/152, 153, 158, 161, 276, 277, 278, 284; 365/233; 713/401, 503

(56) References Cited

U.S. PATENT DOCUMENTS

| | | | |
|---|---|---|---|
| 4,458,165 A | 7/1984 | Jackson ...................... 307/595 |
| 5,118,975 A | 6/1992 | Hillis et al. ................. 307/602 |
| 5,463,337 A | 10/1995 | Leonowich ................. 327/158 |
| 5,663,665 A | 9/1997 | Wang et al. .................... 327/3 |
| 5,684,421 A | 11/1997 | Chapman et al. ........... 327/261 |
| 5,717,353 A | 2/1998 | Fujimoto .................... 327/276 |
| 5,744,991 A | 4/1998 | Jefferson et al. ............ 327/158 |
| 5,909,133 A | 6/1999 | Park ............................ 327/277 |
| 5,946,268 A | 8/1999 | Iwamoto et al. ............ 365/233 |
| 6,011,732 A | 1/2000 | Harrison et al. ............ 365/194 |
| 6,016,282 A | 1/2000 | Keeth ......................... 365/233 |
| 6,066,969 A | 5/2000 | Kawasaki et al. .......... 327/156 |
| 6,069,506 A * | 5/2000 | Miller et al. ................ 327/156 |
| 6,104,224 A | 8/2000 | Koshikawa ................. 327/277 |
| 6,137,334 A | 10/2000 | Miller, Jr. et al. .......... 327/271 |
| 6,173,432 B1 * | 1/2001 | Harrison ......................... 716/1 |
| 6,175,605 B1 | 1/2001 | Chi ............................. 375/371 |
| 6,177,823 B1 | 1/2001 | Saeki .......................... 327/277 |
| 6,194,930 B1 | 2/2001 | Matsuzaki et al. .......... 327/156 |
| 6,230,245 B1 * | 5/2001 | Manning ..................... 711/167 |
| 6,255,880 B1 | 7/2001 | Nguyen ....................... 327/277 |
| 6,327,196 B1 * | 12/2001 | Mullarkey ................... 365/194 |
| 6,349,399 B1 * | 2/2002 | Manning ..................... 714/744 |
| 6,359,482 B1 | 3/2002 | Miller, Jr. et al. .......... 327/156 |
| 6,392,458 B1 | 5/2002 | Miller, Jr. et al. .......... 327/158 |
| 6,470,060 B1 | 10/2002 | Harrison ..................... 375/374 |
| 6,476,653 B1 | 11/2002 | Matsuzaki .................. 327/158 |
| 6,493,829 B1 | 12/2002 | Kubo .......................... 713/500 |
| 6,499,111 B2 * | 12/2002 | Mullarkey ................... 713/401 |

OTHER PUBLICATIONS

Garlepp, Bruno W. et al., "A Portable Digital DLL for High–Speed CMOS Interface Circuits," IEEE Journal of Solid–State Circuits, vol. 34, No. 5, pp. 632–644, May 1999.

* cited by examiner

Primary Examiner—My-Trang Nuton
(74) Attorney, Agent, or Firm—Dorsey & Whitney, LLP

(57) ABSTRACT

A variable delay circuit uses a plurality of inverters or inverting gates as delay elements in a delay line. In one embodiment of the invention, the point in the delay circuit at which an input clock signal enters the delay circuit is adjusted to vary the delay of an output clock signal. In another embodiment, the point in the delay circuit from which the output clock signal exits the delay circuit is adjusted to vary the delay of an output clock signal. In either case, the polarity of the input or output clock signal is adjusted as the delay is adjusted so there are always an even number of inverters or inverting gates between an input terminal to which the input clock signal is applied and an output terminal from which the output clock signal is generated.

17 Claims, 9 Drawing Sheets

VARIABLE DELAY CIRCUIT AND METHOD, AND DELAY LOCKED LOOP, MEMORY DEVICE AND COMPUTER SYSTEM USING SAME

CROSS-REFERENCE TO RELATED APPLICATION

This application is a divisional of pending U.S. patent application Ser. No. 09/943,779, filed Aug. 29, 2001

TECHNICAL FIELD

The invention relates clock circuits, and, more particularly, to a circuit and method for providing a clock signal with a variable delay in a manner that uses relatively little circuitry.

BACKGROUND OF THE INVENTION

Variable delay circuits for delaying digital signals are in common use in a wide variety of integrated circuit devices. For example, variable delay circuits are commonly used as part of delay locked loops in integrated circuit memory devices. An example of a conventional variable delay circuit 10 is shown in FIG. 1. The variable delay circuit 10 includes a series of inverters 12a, b, c, d, e, the first of which 12a receives a clock signal CLK. The output of each inverter 12a, b, c, d, e is coupled to a respective pass gate 16a, b, c, d, e that are selectively enabled by respective stages of a shift register 18. Only one of the stages of the shift register stores a logic "1", and all of the other stages store a logic "0". The pass gate 16a, b, c, d, e that receives the logic "1" is enabled while the remaining pass gates 16a, b, c, d, e that receive a logic "0" are disabled. The logic "1" is shifted to the right by applying a shift pulse to a DELAY INCR input of the shift register 18, and is shifted to the left by applying a shift pulse to a DELAY DECR input of the shift register 18. Outputs of all of the pass gates 16a, b, c, d, e are coupled to each other to generate a delayed clock signal at a CLK-OUT terminal.

In operation, one of the pass gates 16a, b, c, d, e is enabled by receiving a logic "1" from the shift register 18, thereby coupling the output from the respective inverter 12a, b, c, to the CLK-OUT terminal. The magnitude of the delay of the CLK-OUT signal is adjusted by shifting the logic "1" right and left by applying a shift pulse to the DELAY INCR input or DELAY DECR input, respectively, of the shift register 18.

Although the variable delay circuit 10 of FIG. 1 provides adequate performance under some circumstances, it has the significant disadvantage of inverting the clock signal as the delay is switched from one inverter 12a, b, c, d, e to the next. More specifically, for example, when the logic "1" is shifted from the pass gate 16b to the pass gate 16c, the delay of CLK-OUT signal shifts by not only the additional delay of the inverter 12c, but, because of the additional inversion caused by passing though the inverter, an additional delay of one-half the period of the CLK signal. This additional delay can be a significant problem in some applications.

The above-described problem with the conventional variable delay circuit 10 is well recognized, and has been solved to some extent by using a variable delay circuit 30 as shown in FIG. 2. The variable delay circuit 30 uses many of the same components used in the variable delay circuit 10 of FIG. 1, and these components have been provided with the same reference numerals. The delay circuit 30 differs from the delay circuit 10 by including an additional series of inverters 32a, b, c, d, e, the first of which 32a receives CLK*, which is the compliment of the CLK signal. The connections to the pass gates 16a, b, c, d, e then alternate between the inverters 12a, b, c, d, e and the inverters 32a, b, c, d, e so all of the pass gates 16a, b, c, d, e receive the same phase of the clock signal. As a result, when the logic "1" is shifted from one pass gate 16a, b, c, d, e to the next, the delay of the CLK-OUT signal varies by only the delay of the additional inverter 12 or 32.

Although the variable delay circuit 30 avoids the major problem with the delay circuit 10, it does so at the expense of doubling the number of required inverters. The extra circuitry and consequent expense of these additional inverters can be significant, particularly where a large number of inverters are need to provide a large delay or a large number of delay increments.

There is therefore a need for a variable delay circuit that avoids the problem of inverting the clock signal from one stage to the next, but does so in a manner that does not require a doubling of the number of inverters needed to achieve a desired delay or a number of delay increments.

SUMMARY OF THE INVENTION

A variable delay circuit produces a delayed clock signal from an input clock signal by coupling the input clock signal through a plurality of inverting logic circuits arranged in series with each other. A delay select circuit, such as a shift register, receives at least one delay command signal indicative of a delay of the variable delay circuit. The delay select circuit then generates at least one control signal responsive to the delay command signal. The variable delay circuit also includes a clock transfer control circuit coupled to the inverting logic circuits and the delay select circuit. The clock transfer control circuit receives the input clock signal and adjusts the delay of the delayed clock signal responsive to the at least one control signal. The delay is adjusted by varying the number of inverting logic circuits through which the input clock signal is coupled between the clock input terminal and the clock output terminal. The clock transfer control circuit also adjusts the polarity of the input clock signal between the clock input terminal and the clock output terminal as a function of the at least one control signal so that the correct polarity of the delayed clock signal is maintained despite being coupled through a variable number of inverting logic circuits.

DETAILED DESCRIPTION OF THE INVENTION

Figure 3:
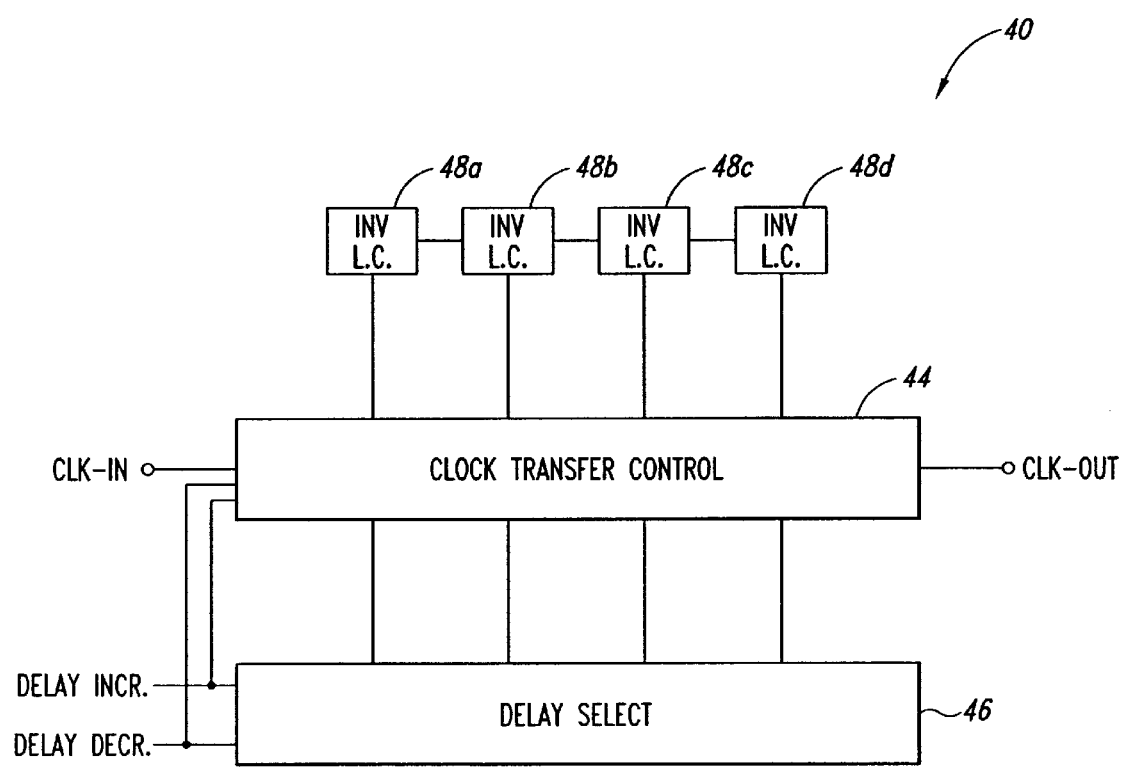
FIG. 3 is a block diagram showing one embodiment of a variable delay circuit according to the present invention.

FIG. 3 is a block diagram of one embodiment of a variable delay circuit 40 according to the present invention. The delay circuit 40 included a clock transfer control circuit 44 to which an incoming clock signal CLK-IN is applied and from which a delayed clock signal CLK-OUT is generated. The transfer control circuit 44 also receives DELAY INCR and DELAY DECR pulses that are also applied to a delay select circuit 46. The clock transfer circuit 44 is coupled to the delay select circuit 46 and to a plurality of inverting logic circuits 48a, b, c, d.

In operation, the delay select circuit 46 outputs a signal on one of its interconnections to the clock transfer circuit 44 that selects the magnitude of the delay of the CLK-OUT signal. The interconnection on which the select signal is generated is shifted in one direction to increase the delay responsive to each DELAY INCR pulse, and is shifted in the other direction to decrease the delay responsive to each DELAY DECR pulse. The select signal may be, for example, a logic "1" signal.

The transfer control circuit 44 transfers the CLK-IN signal to one of the inverting logic circuits 48 and transfers the CLK-OUT signal from one of the inverting logic circuits. The transfer control circuit 44 does so by selecting the entry point for the CLK-IN signal and/or the exit point of the CLK-OUT signal in the chain of inverting logic circuits 48. For example, the CLK-IN signal may be applied to the first inverting logic circuit 48a, and the delay select circuit 46 may cause the clock transfer control circuit 44 to couple the output of the inverting logic circuit 48c to the CLK-OUT terminal. In response to a DELAY INCR pulse, the delay select circuit 46 causes the clock transfer control circuit 44 to couple the output of the inverting logic circuit 48d to the CLK-OUT terminal. In response to a DELAY DECR pulse, the delay select circuit 46 causes the clock transfer control circuit 44 to couple the output of the inverting logic circuit 48b to the CLK-OUT terminal. Alternatively, for example, the clock transfer control circuit 44 may couple the output of the inverting logic circuit 48d to the CLK-OUT terminal, and may vary the inverting logic circuit 48 to which the CLK-IN signal is applied. For example, the delay select circuit 46 may cause the clock transfer control circuit 44 to couple the CLK-IN signal to the second inverting logic circuit 48b. In response to a DELAY INCR pulse, the delay select circuit 46 causes the clock transfer control circuit 44 to couple the CLK-IN signal to the input of the first inverting logic circuit 48a. In response to a DELAY DECR pulse, the delay select circuit 46 causes the clock transfer control circuit 44 to couple the CLK-IN signal to the input of the third inverting logic circuit 48c. The delay select circuit 46 may also causes the clock transfer control circuit 44 to adjust both the inverting logic circuit 48 to which the CLK-IN signal is applied and the inverting logic circuit 48 from which the CLK-OUT signal is taken.

Figure 1:
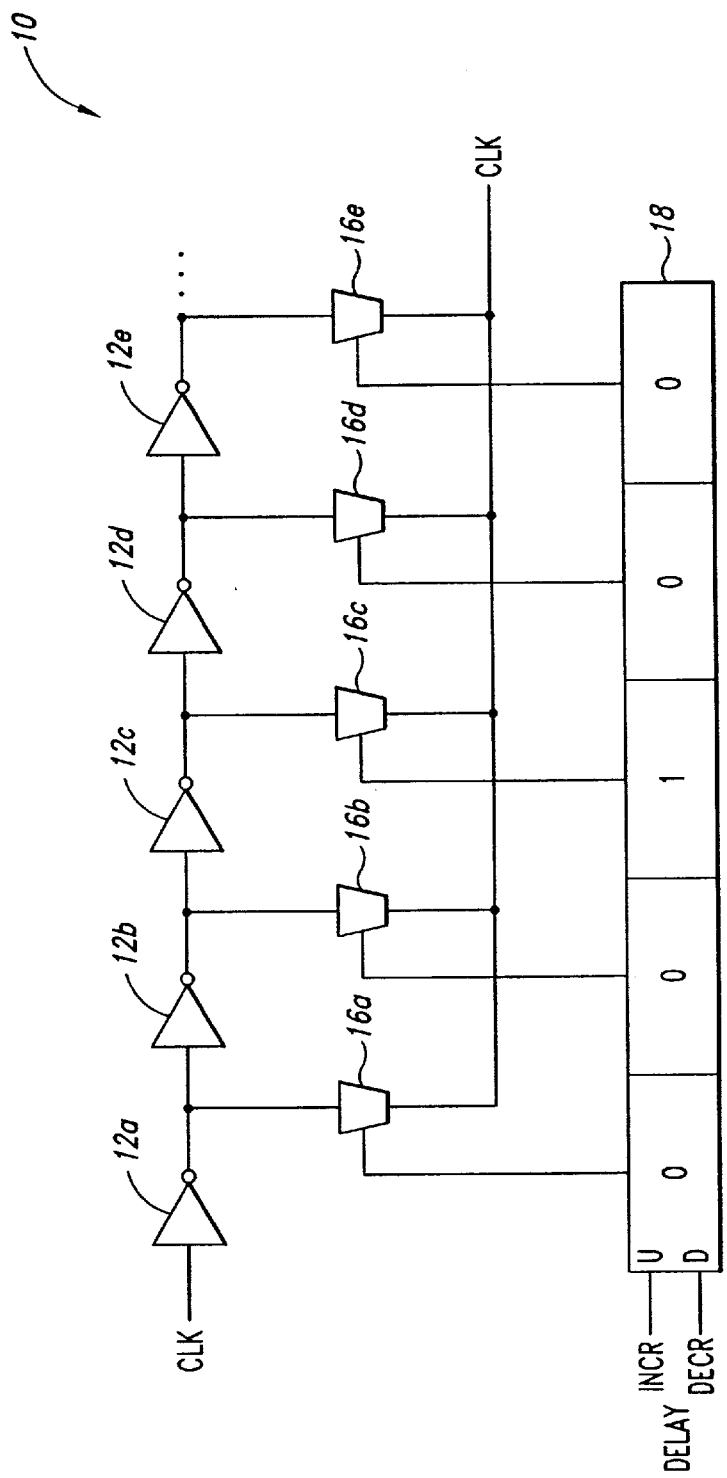
FIG. 1 is a logic diagram showing a conventional variable delay circuit.
Figure 2:
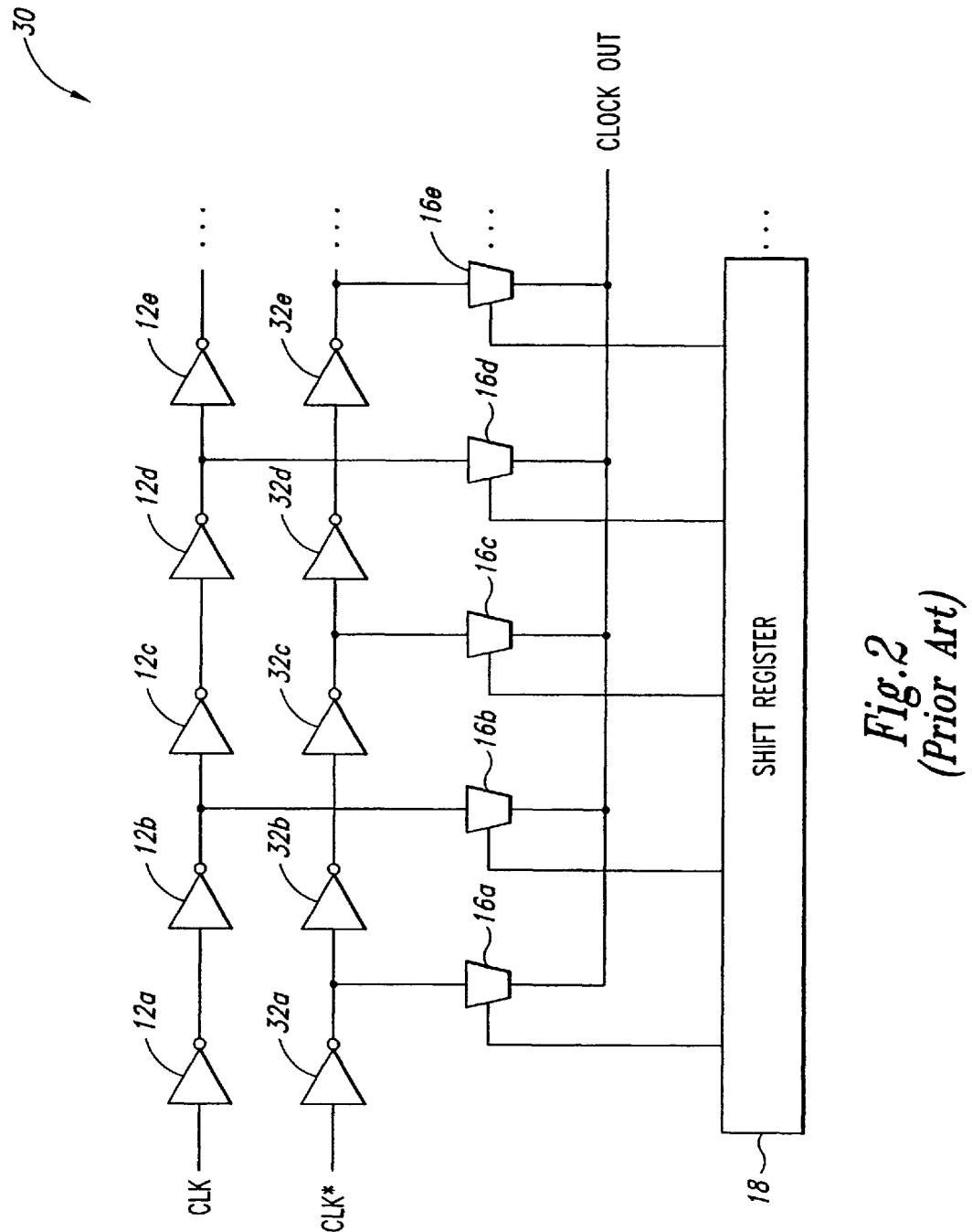
FIG. 2 is a logic diagram showing another conventional variable delay circuit.

If the operation of the variable delay circuit 40 was limited to the operation described above, it would exhibit the same problem as the variable delay circuit 10 of FIG. 1. Specifically, the delay of the CLK-OUT signal would increment and decrement by the sum of the delay of each inverting logic circuit 48 and one-half the period of the CLK-IN signal. To prevent these unwanted inversions, the clock transfer control circuit 44 either inverts the CLK-IN signal or the CLK-OUT signal each time it alters the inverting logic circuit 48 to which the CLK-IN signal is applied and/or from which the CLK-OUT signal is derived. For example, the clock transfer control circuit 44 may initially apply the CLK-IN signal to the inverting logic circuit 48b. In response to a DELAY INCR pulse, the clock transfer control circuit 44 either applies the compliment of the CLK-IN signal to the inverting logic circuit 48a or inverts the signal coupled from the inverting logic circuit 48d to derive the CLK-OUT signal so the phase of the CLK-OUT signal remains constant. As a result, the delay of the CLK-OUT signal increases by only the delay of a single inverting logic circuit 48.

The clock transfer control circuit 44 operates in a similar manner when changing the inverting logic circuit 48 from which the CLK-OUT signal is derived. For example, the clock transfer control circuit 44 may initially derive the CLK-OUT signal from the inverting logic circuit 48c. In response to a DELAY DECR pulse, the clock transfer control circuit 44 derives the CLK-OUT signal from the inverting logic circuit 48b, and inverts either the CLK-IN signal before it is applied to one of the inverting logic circuit or the signal coupled from one of the inverting logic circuits 48 that is used to derive the CLK-OUT signal.

Figure 4:
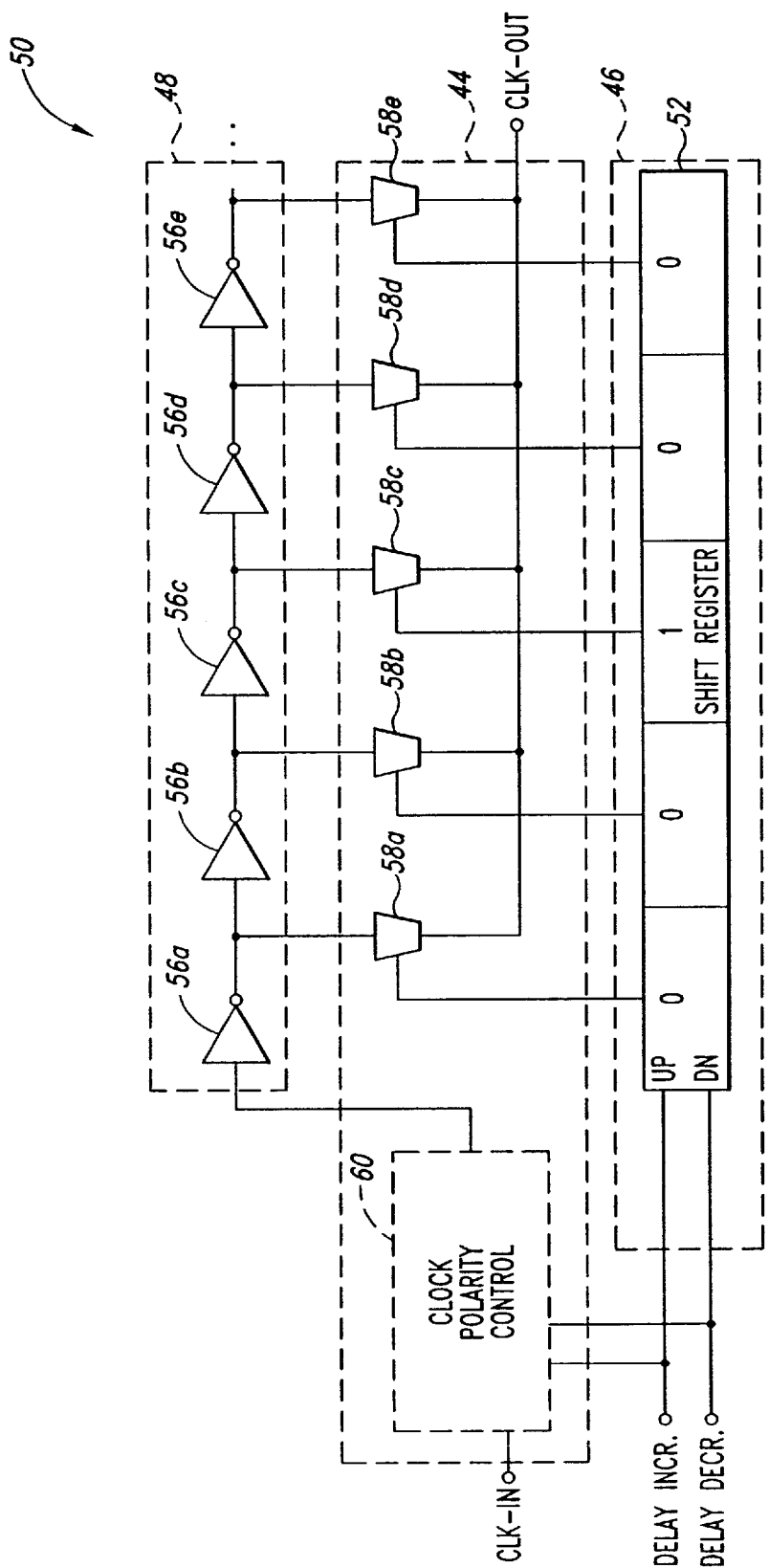
FIG. 4 is a logic diagram showing one embodiment of the variable delay circuit of FIG. 3.

The variable delay circuit 40 may be implemented with a variety of circuitry, one embodiment of which is shown in FIG. 4. As shown in FIG. 4, a variable delay circuit 50 includes a shift register 52 as the delay select circuit 46, and a plurality of inverters 56a, b, c, d, e as the inverting logic circuits 48. However, it will be understood that inverting logic circuits other than the inverters 56a, b, c, d, e, such as NOR-gates and NAND-gates (not shown), may be used. The clock transfer control circuit 44 includes a set of pass gates 58a, b, c, d, e that selectively couple the outputs of respective inverters 56a, b, c, d, e to a CLK-OUT terminal. The operation of the shift register 40, pass gates 58a, b, c, d, e and inverters 56a, b, c, d, e are essentially as described above with reference to FIG. 1 for the shift register 18, pass gates 16a, b, c, d, e and inverters 12a, b, c, d, e.

The clock transfer control circuit 44 also includes a polarity control circuit 60 that selectively inverts the CLK-IN signal before it is applied to one of the inverters 56. The polarity control circuit 60 receives the DELAY INCR and DELAY DECR pulses, as well as the CLK-IN signal, and is operable to alter the inversion of the CLK-IN signal responsive to each DELAY INCR or DELAY DECR pulse before applying the CLK-IN signal or its compliment to the inverter 56a. For example, the polarity control circuit 60 may initially not invert the CLK-IN signal before coupling it to the input of the inverter 56a. In response to either a DELAY INCR pulse or a DELAY DECR pulse, the polarity control circuit 60 inverts the CLK-IN signal before coupling it to the input of the inverter 56a. As a result, the CLK-IN signal is inverted each time the pass gates 58 change the inverter 56 from which the CLK-OUT signal is derived. The delay of the CLK-OUT signal thus changes responsive to each DELAY INCR pulse or a DELAY DECR pulse by only the delay of a single inverter 56. In this manner, the variable delay circuit 40 is able to prevent unwanted inversions of clock signal without using a second set of inverters, thereby using relatively little circuitry. Although circuitry for the polarity control circuit 60 must be added to the circuitry used in the prior art variable delay circuit 10 of FIG. 1, the amount of circuitry needed to implement the polarity control circuit 60 does not increase with the number of inverters 56. The amount of circuitry needed for the polarity control circuit 60 is thus relatively little in the event a large number of inverters are needed to provide a large number of delay values.

Figure 5:
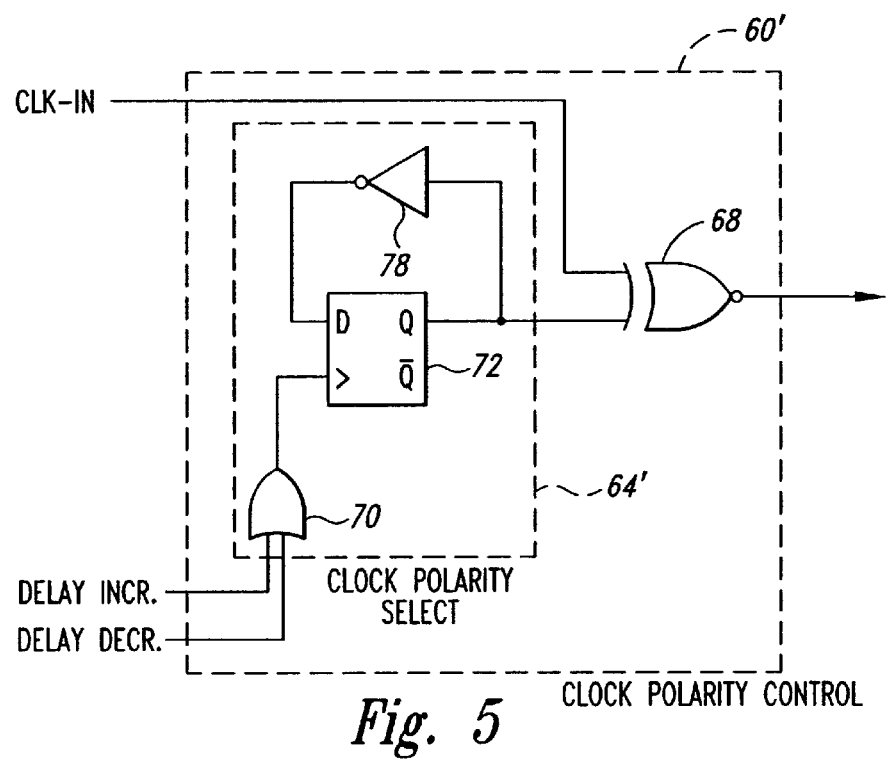
FIG. 5 is a logic diagram showing one embodiment of a clock polarity control circuit used in the variable delay circuit of FIG. 4.

One embodiment of a polarity control circuit 60' using an exclusive NOR-gate 68 and a clock polarity selector 64' is shown in FIG. 5. The clock polarity selector 64' includes an NOR-gate 70 having inputs coupled to receive both DELAY INCR and DELAY DECR pulses, thereby clocking a flip-flop 72. A Q output of the flip-flop 72 is coupled to its data input D through an inverter 78. As a result, the Q output of the flip-flop toggles from logic "0" to logic "1" and vice-versa responsive to each DELAY INCR and DELAY DECR pulse. The Q output of the flip-flop 72 is applied to one input of the exclusive NOR-gate 68, which also receives the CLK-IN signal at its other input. The flip-flop 72 thus causes the exclusive NOR-gate 68 to alter its inverting function responsive to each DELAY INCR or DELAY DECR pulse. For example, the flip-flop 72 may initially apply a logic "0" to the exclusive NOR-gate 68 so that the exclusive NOR-gate does not invert the CLK-IN signal before coupling it to the input of the inverter 56a. In response to either a DELAY INCR pulse or a DELAY DECR pulse, the flip-flop 72 applies a logic "1" to the exclusive NOR-gate 68, thereby causing it to invert the CLK-IN signal before coupling it to the input of the inverter 56a. As a result, the CLK-IN signal is inverted each time the pass gates 58 change the inverter 56 from which the CLK-OUT signal is derived. The delay of the CLK-OUT signal thus changes responsive to each DELAY INCR pulse or a DELAY DECR pulse by only the delay of a single inverter 56.

Figure 6:
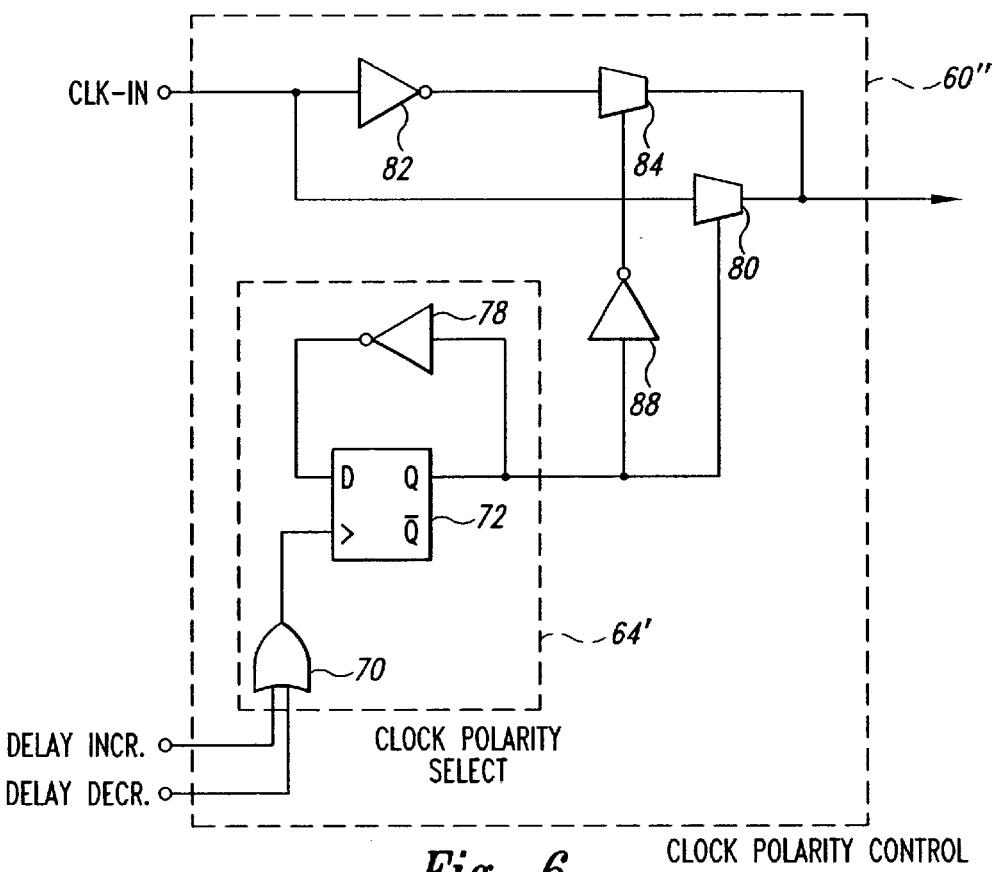
FIG. 6 is a logic diagram showing another embodiment of a clock polarity control circuit used in the variable delay circuit of FIG. 4.

Another embodiment of a polarity control circuit 60" is shown in FIG. 6. The polarity control circuit 60" uses the clock polarity selector 64' of FIG. 5. However, instead of using an exclusive-OR gate, the polarity control circuit 60" uses a non-inverting clock path formed by a pass gate 80 in parallel with an inverting clock path formed by an inverter 82 coupled in series with a pass gate 84. The Q output of the flip-flop 72 is coupled directly to a control input of the pass gate 80 and to the control input of the pass gate 84 through an inverter 88. As a result, the pass gates 80, 84 are alternately enabled, and the particular pass gate 80, 84 that is enabled changes each time the Q output of the flip-flop 72 toggles. When the pass gate 80 is enabled, the CLK-IN signal is coupled directly to the inverter 56a (FIG. 4). When the pass gate 84 is enabled, the CLK-IN signal is inverted before being coupled to the inverter 56a so that the inverter 56a receives the compliment of the CLK-IN signal.

Figure 7:
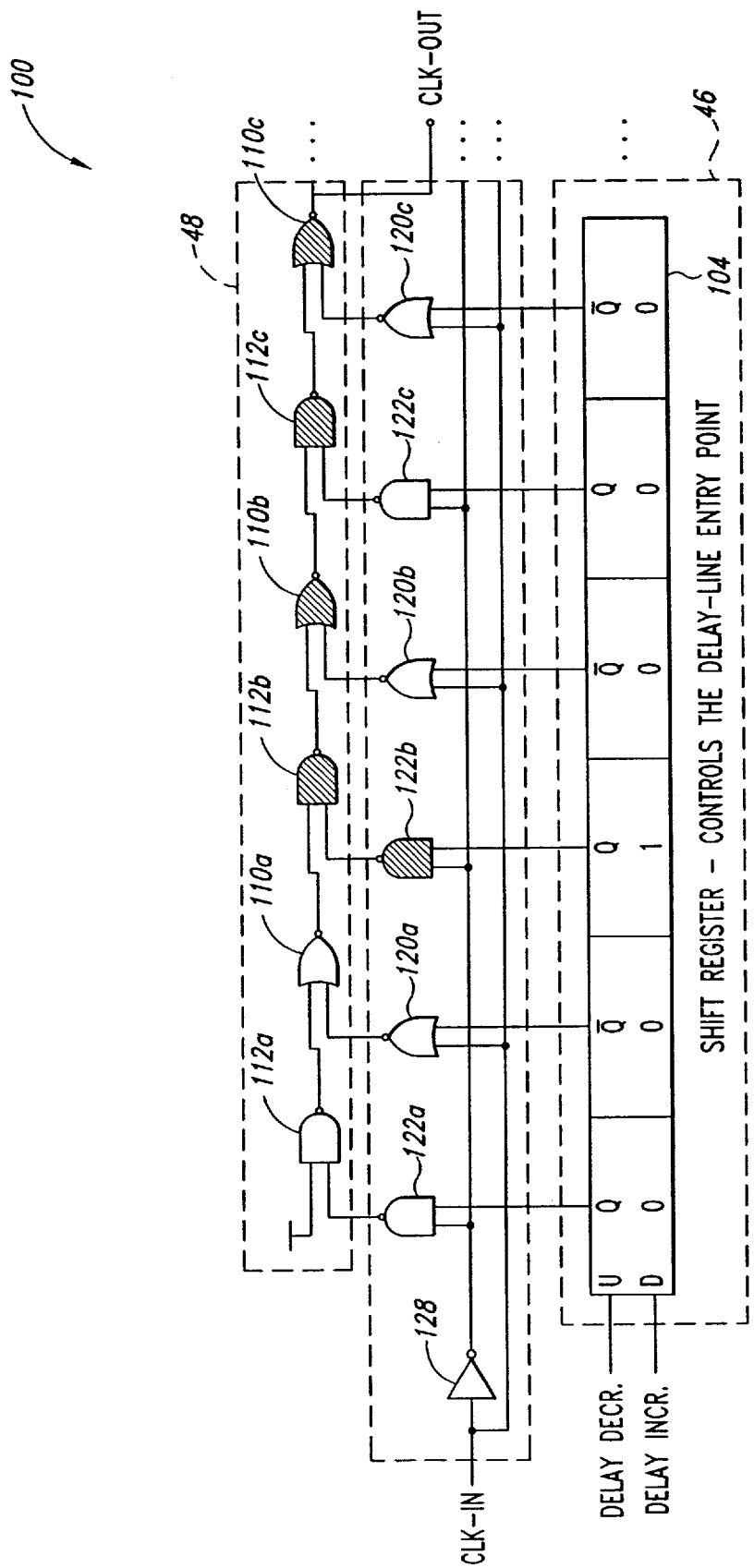
FIG. 7 is a logic diagram showing another embodiment of the variable delay circuit of FIG. 3.

Another embodiment of a variable delay circuit 100 according to the present invention is shown in FIG. 7. Unlike the variable delay circuit 50 of FIG. 4, the variable delay circuit varies the delay of the CLK-OUT signal by varying the entry point of the CLK-IN signal into the chain of inverting logic circuits 48 (FIG. 3). With reference to FIG. 7, the variable delay circuit 100 includes as the delay select circuit 46 a shift register 104 receiving DELAY INCR and DELAY DECR pulses, as previously explained. However, the DELAY INCR and DELAY DECR pulses shift the logic "1" in directions opposite the directions they shift the logic "1" in the shift register 52 of FIG. 4 since the variable delay circuit alters the entry point into the series of inverting logic circuits 48 rather than the exit point from the series of inverting logic circuits 48. The variable delay circuit 100 also includes as the inverting logic circuits 48 a series of alternating NOR-gates 110a, b, c and NAND-gates 112a, b, c. Finally, the clock transfer control circuit 44 is implemented by a plurality of NOR-gates 120a, b, c alternating with a plurality of NAND-gates 122a, b, c. The output of each NOR-gate 120a, b, c is coupled to an input of a respective NOR gate 110a, b, c, and the output of each of the NAND-gates 122a, b, c is coupled to an input of a respective NAND-gate 112a, b, c. Each of the NAND-gates 122a, b, c in the clock transfer control circuit 44 receives a control input from the Q output of a respective stage of the shift register 104. Each of the NOR-gates 120a, b, c in the clock transfer control circuit 44 receives a control input from the Q* output of a respective stage of the shift register 104. Thus, when a shift register stage stores a logic "0", the Q outputs of the stages output a logic "0" and the Q* outputs of the stages output a logic "1". Each of the NOR-gates 120a, b, c also receives the CLK-IN signal, and each of the NAND-gates 122a, b, c receives the compliment of the CLK-IN signal generated by applying the CLK-IN signal to an inverter 128.

The operation of the variable delay circuit 100 will now be explained assuming the stage of the shift register 104 coupled to the NAND-gate 122b is storing a logic "1". The logic "1" applied to the NAND-gate 122b enables the gate 122b, thereby allowing the CLK-IN* signal to be coupled through the NAND-gate 122b. At the same time, each of the other NAND-gates 122a, c receives a logic "0", thereby disabling the gates 122a, c and causing them to output a logic "1" to a respective NAND-gate 112a, c. Additionally, each of the other NOR-gates 120a, b, c receives a logic "1", thereby disabling the gates 120a, b, c and causing them to output a logic "0" to a respective NOR-gate 110a, b, c. Thus, all of the gates 110, 112 in the delay chain are enabled. As a result, the CLK-IN* signal coupled through the NAND-gate 122b is coupled through the NAND-gate 112b, the NOR-gate 110b, the NAND-gate 112c, and the NOR-gate 110c before being applied to the CLK-OUT terminal. Note that there are an even number of inverting logic circuits, i.e., inverter 128 and gates 122b, 112b, 110b, 112c, 110c, between the CLK-IN terminal and the CLK-OUT terminal so that the CLK-OUT signal is a delayed but non-inverted replica of the CLK-IN signal.

If the shift register 104 receives a DELAY INCR pulse, the stage storing a logic "1" shifts to the left so the NOR-gate 120a receives a logic "0" to enable it to pass the CLK-IN signal. Again, each of the other NAND-gates 122a, b, c receives a logic "0", thereby disabling the gates 122a, b, c and causing them to output a logic "1" to enable a respective NAND-gate 112a, b, c. Additionally, each of the other NOR-gates 120b, c receives a logic "1", thereby disabling the gates 120b, c and causing them to output a logic "0" to enable a respective NOR-gate 110b, c. The CLK-IN signal coupled through the NOR-gate 120a is coupled through the NOR-gate 110a, the NAND-gate 112b, the NOR-gate 110b, the NAND-gate 112c, and the NOR-gate 110c before being applied to the CLK-OUT terminal. Note again that there are still an even number of inverting logic circuits, i.e., gates 120a, 110a, 112b, 110b, 112c, 110c, between the CLK-IN terminal and the CLK-OUT terminal so that the CLK-OUT signal is again a delayed but non-inverted replica of the CLK-IN signal. The variable delay circuit responds in a similar manner to DELAY DECR pulses.

It is thus seen that, by adjusting the polarity of the CLK-IN signal before it is applied to the inverting logic circuits, the delay of the CLK-OUT signal can be adjusted without introducing unwanted inversions of the CLK-IN signal. Further, this is accomplished without using two inverting logic circuits for each stage of the delay line.

Figure 8:
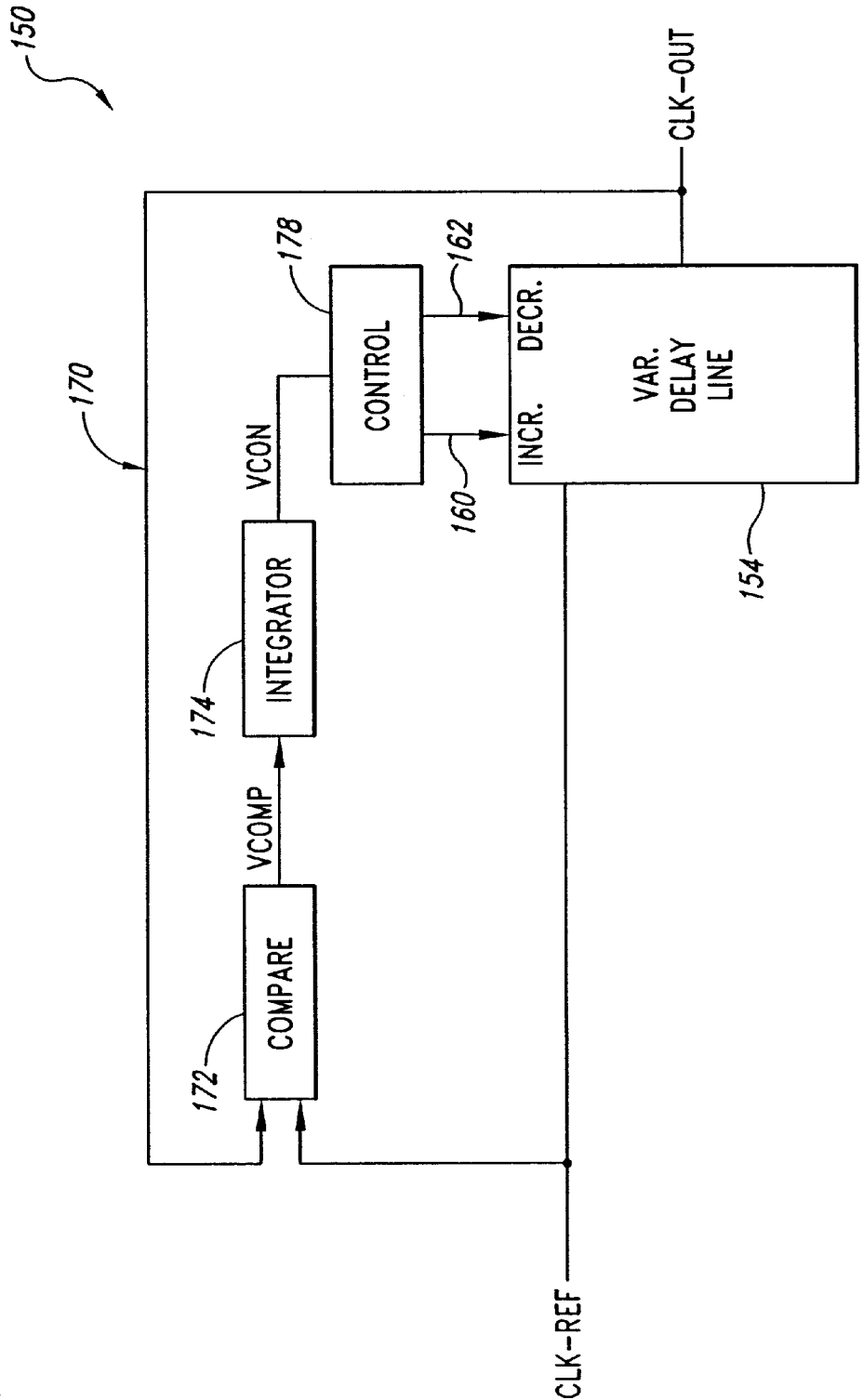
FIG. 8 is a block diagram of a delay-locked loop using one or more of the variable delay circuit embodiments according to the present invention.

The variable delay lines 40, 50, 100 may be used in a variety of circuits, including a delay-locked loop, such as the delay-locked loop 150 shown in FIG. 8. A clock reference signal CLK-REF is applied to a variable delay line 154, which may be one of the variable delay lines 40, 50, 100 or some other variable delay line in accordance with the invention. As explained above, an clock output signal CLK-OUT is output from the variable delay line 154 with a delay that is determined by a INCR control pulses on line 160 and DECR control pulses on line 162.

A feedback loop 170, formed by a comparator 172, an integrator 174 and a control circuit 178 of conventional design, produces the INCR and DECR control pulses. The feedback loop 170 receives the clock reference signal CLK-REF at one input of the comparator 172 and receives the clock output signal CLK-OUT from the variable delay line 154 as a feedback signal at the other input of the comparator 172. The comparator 172 outputs a compare pulses VCOMP that are integrated by the integrator 174 to apply a control signal VCON to the control circuit 178. The control circuit 178 then produces the INCR and DECR control pulses to maintain a predetermined relationship between the phase of the clock reference signal CLK-REF and the clock output signal CLK-OUT.

In operation, the control signal VCON will depend upon the relative phases of the clock reference signal CLK-REF and the clock output signal CLK-OUT. If the clock output signal CLK-OUT leads the clock reference signal CLK-REF, the control signal VCON causes the control circuit 178 to apply INCR pulses to the variable delay line 154 to increase the delay of the variable delay line 154 until the clock output signal CLK-OUT is in phase with the clock reference signal CLK-REF. Similarly, if the clock output signal CLK-OUT lags the clock reference signal CLK-REF, the control signal VCON causes the control circuit 178 to apply DECR pulses to the variable delay line 154 to decrease the delay of the variable delay line 154 until the clock output signal CLK-OUT is in phase with the clock reference signal CLK-REF.

Is shown in FIG. 8 in the context of a delay-locked loop, it will be understood it can be used in other types of locked-loops, such as phase-locked loops.

Although the variable delay line 154, which may be the variable delay lines 40, 50, 100, is shown in FIG. 8 in the context of a delay-locked loop, it will be understood it can be used in other types of locked-loops, such as phase-locked loops, as well as in a wide variety of digital circuits. For example, the variable delay lines in accordance with the invention may be used in a memory device, such as a synchronous dynamic random access memory ("SDRAM") 200 shown in FIG. 9. Similarly, the delay-locked loop 150 shown in FIG. 8 may be used the SDRAM 200 as well as in a variety of other circuits. The memory device illustrated therein is a synchronous dynamic random access memory ("SDRAM") 200, although the invention can be embodied in other types of synchronous DRAMs, such as packetized DRAMs and RAMBUS DRAMs (RDRAMS"), as well as other types of digital devices. The SDRAM 200 includes an address register 212 that receives either a row address or a column address on an address bus 214. The address bus 214 is generally coupled to a memory controller (not shown). Typically, a row address is initially received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which applies various signals to its respective array 220 or 222 as a function of the stored row address. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248 which applies various signals to respective sense amplifiers and associated column circuitry 250, 252 for the respective arrays 220, 222.

Data to be read from one of the arrays 220, 222 is coupled to the column circuitry 250, 252 for one of the arrays 220, 222, respectively. The data is then coupled through a read data path 254 to a data output register 256, which applies the data to a data bus 258. Data to be written to one of the arrays 220, 222 is coupled from the data bus 258, a data input register 260 and a write data path 262 to the column circuitry 250, 252 where it is transferred to one of the arrays 220, 222, respectively. A mask register 264 may be used to selectively alter the flow of data into and out of the column circuitry 250, 252, such as by selectively masking data to be read from the arrays 220, 222.

The above-described operation of the SDRAM 200 is controlled by a command decoder 268 responsive to command signals received on a control bus 270. These high level command signals, which are typically generated by a memory controller (not shown), are a clock enable signal CKE*, a clock signal CLK, a chip select signal CS*, a write enable signal WE*, a row address strobe signal RAS*, and a column address strobe signal CAS*, which the "*" designating the signal as active low. Various combinations of these signals are registered as respective commands, such as a read command or a write command. The command decoder 268 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted. The CLK signal may be used to generate an internal clock signal ICLK by coupling the CLK signal to a clock generator circuit 272 that uses one or more of the variable delay lines 40, 50, 100 in accordance with various embodiments of the invention. The clock generator circuit 272 may also use the delay-locked loop 150 shown in FIG. 8 or some other delay-locked loop using one or more of the variable delay lines 40, 50, 100.

Figure 9:
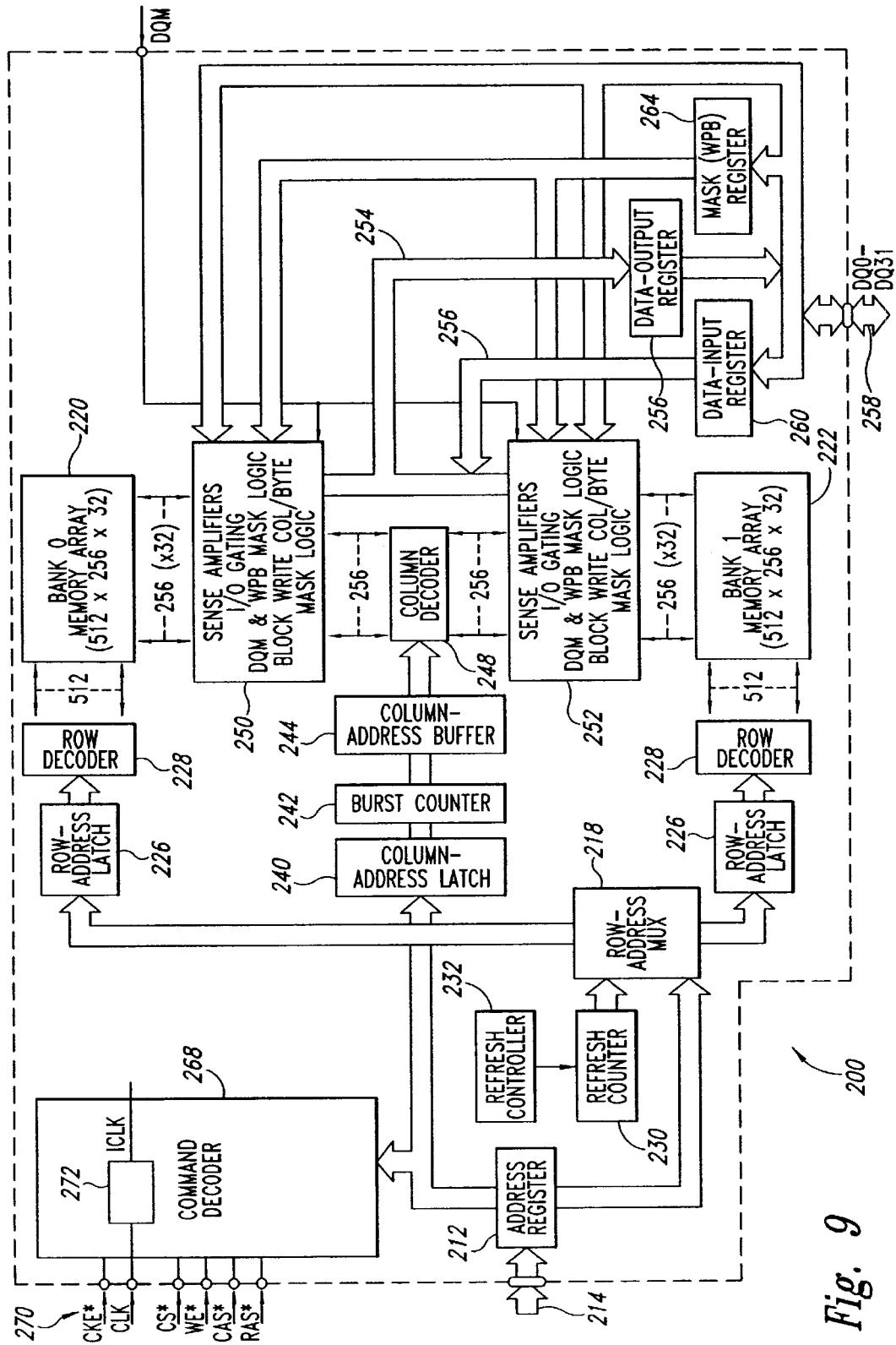
FIG. 9 is a block diagram of a memory device using one or more of the variable delay circuit embodiments, or a delay-locked loop using one or more of the variable delay circuit embodiments, according to the present invention.
Figure 10:
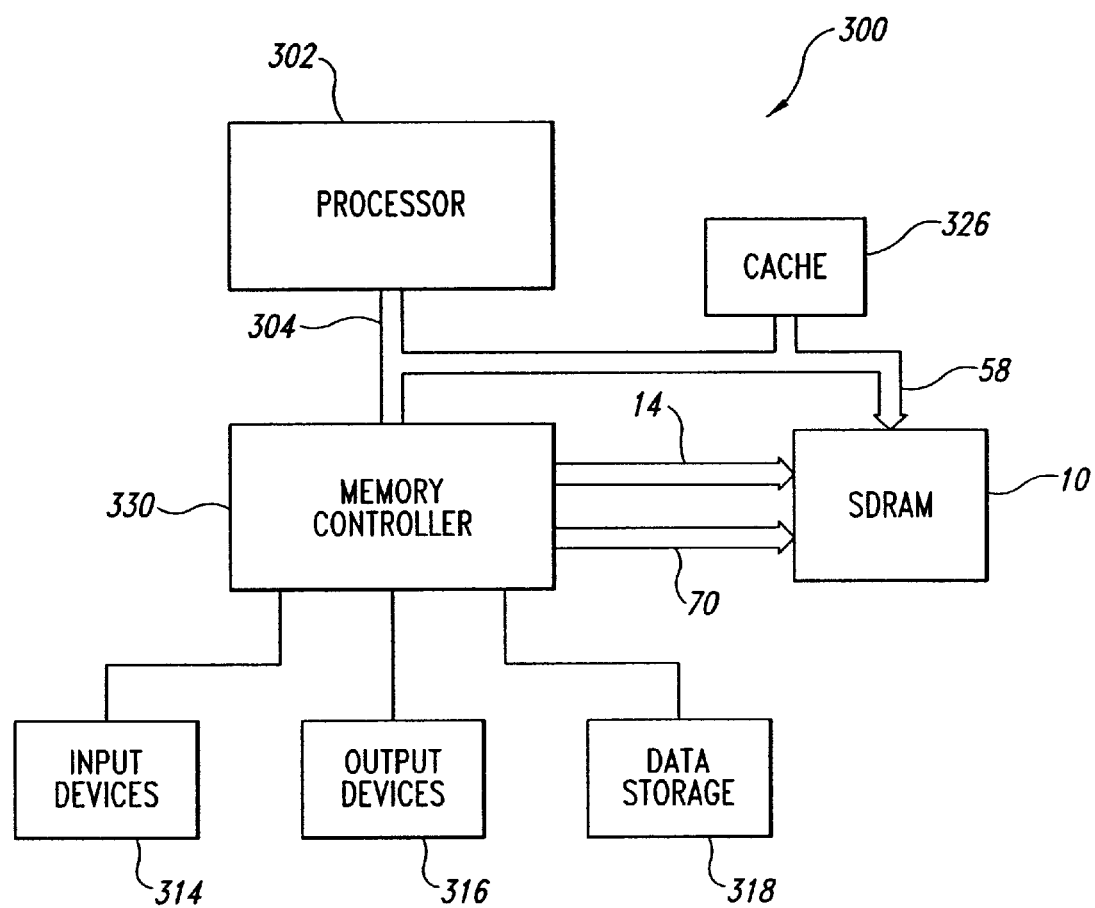
FIG. 10 is a block diagram of a computer system using the memory device of FIG. 9.

FIG. 10 shows a computer system 300 containing the SDRAM 200 of FIG. 9. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM"), and to the SDRAM 200 through a memory controller 330. The memory controller 330 normally includes a control bus 336 and an address bus 338 that are coupled to the SDRAM 200. A data bus 340 is coupled from the SDRAM 200 to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A computer system, comprising:
 a processor having a processor bus;
 an input device coupled to the processor through the processor bus adapted to allow data to be entered into the computer system;
 an output device coupled to the processor through the processor bus adapted to allow data to be output from the computer system; and
 a memory device coupled to the processor bus adapted to allow data to be stored, the memory device comprising:
  a row address circuit operable to receive row address signals applied to a first external terminal and to decode the row address signals to provide a row address;
  a column address circuit operable to receive column address signals applied to a second external terminal and to decode the column address signals to provide a column address;
  at least one array of memory cells operable to store data written to or read from the array at a location determined by the row address and the column address;
  a data path circuit operable to couple data signals corresponding to the data between the at least one array and an external data terminal;
  a command signal generator operable to generate a sequence of control signals corresponding to command signals applied to a third external terminal; and
  a clock processing circuit receiving an input clock signal at a clock input terminal and generating an output clock signal, the clock processing circuit including a variable delay circuit comprising:
   a plurality of inverting logic circuits arranged in series with each other;
   a delay select circuit receiving at least one delay command signal indicative of a delay of the variable delay circuit, the delay select circuit being operable to generate at least one control signal responsive to the delay command signal; and
   a clock transfer control circuit coupled to the inverting logic circuits, the delay select circuit, and the clock input terminal, the clock transfer control circuit being operable responsive to the at least one control signal to vary the number of inverting logic circuits through which the input clock signal is coupled between the clock input terminal and a clock output terminal, the clock transfer control circuit further being operable to adjust the polarity of the input clock signal between the clock input terminal and the clock output terminal as a function of the at least one control signal.

2. The computer system of claim 1 wherein the clock transfer control circuit is operable responsive to the at least one control signal to select the entry point of the input clock signal into the plurality of inverting logic circuits.

3. The computer system of claim 1 wherein the clock transfer control circuit is operable responsive to the at least one control signal to select an exit point of the delayed clock signal from the plurality of inverting logic circuits.

4. The computer system of claim 1 wherein each of the inverting logic circuits comprise an inverter.

5. The computer system of claim 1 wherein each of the inverting logic circuits comprise a logic gate.

6. The computer system of claim 1 wherein the delay select circuit comprises a shift register having a plurality of stages each of which provides a respective control signal, one of the shift register stages storing a unique data bit that is different from the data bits stored in the other shift register stages.

7. The computer system of claim 6 wherein the clock transfer control circuit comprises:
 a plurality of pass gates each of which is coupled between the output of a respective inverting logic circuit and the output terminal, each of the pass gates having a control terminal coupled to a respective stage of the shift register; and
 a polarity control circuit coupled to the logic control circuits so that the input clock signal is coupled through the polarity control circuit between the input terminal and the output terminal, the polarity control circuit being operable to alternately invert and not invert the clock signal coupled therethrough as the unique data bit shifts from one shift register stage to the next.

8. The computer system of claim 7 wherein the polarity control circuit is coupled between the clock input terminal and a first in the series of the inverting logic circuits.

9. The computer system of claim 7 wherein the polarity control circuit comprises:
 an exclusive logic gate having at least first and second inputs, the first input being coupled to receive the input clock signal; and
 a toggle circuit having an output that is coupled to the second input of the exclusive logic gate, the toggle circuit being operable to change a logic level on the output of the toggle circuit between two values responsive to shifting of the unique data bit from one shift register stage to the next.

10. The computer system of claim 9 wherein the exclusive logic gate comprises an exclusive NOR-gate.

11. The computer system of claim 9 wherein the toggle circuit comprises a flip-flop having a data input, a clock input, and an output, the output being coupled to the second input of the exclusive logic gate and to the data input of the flip-flop in inverting fashion so that clocking the output of the flip-flop that is coupled to the data input of the flip-flop cause a change in the flip-flop output, the flip-flop being clocked responsive to changes in the at least one command signal indicative of changes in the delay of the variable delay circuit.

12. The computer system of claim 7 wherein the polarity control circuit comprises:

an inverter coupled to receive the input clock signal, the inverter generating a complimentary clock signal;

a first pass gate coupling the input clock signal to a first in the series of inverting logic circuits;

a second pass gate coupling the complimentary clock signal to the first in the series of inverting logic circuits; and a toggle circuit having an output and being operable to change a logic level on the output of the toggle circuit between two values responsive to shifting of the unique data bit from one shift register stage to the next, the output of the toggle circuit being coupled to respective control inputs of both of the pass gates, the control input of one of the pass gates being coupled to the toggle circuit through an inverter so that the first and second pass gates are alternately enabled and disabled.

13. The computer system of claim 12 wherein the toggle circuit comprises a flip-flop having a data input, a clock input, and an output, the output being coupled to the second input of the exclusive logic gate and to the data input of the flip-flop in inverting fashion so that clocking the output of the flip-flop that is coupled to the data input of the flip-flop cause a change in the flip-flop output, the flip-flop being clocked responsive to changes in the at least one command signal indicative of changes in the delay of the variable delay circuit.

14. The computer system of claim 6 wherein the inverting logic circuits comprise a plurality of inverting logic gates coupled together in a series, the inverting logic gates having respective first inputs, and wherein the clock transfer control circuit comprises:

an inverter coupled to receive the input clock signal, the inverter generating a complimentary clock signal; and a plurality of control logic gates each having a first input coupled to a respective stage of the shift register and an output coupled to the first input of a respective inverting logic gate, the second inputs of alternating control logic gates being coupled to receive the input clock signal, and the second inputs of the remaining control logic gates being coupled to receive the complimentary clock signal.

15. The computer system of claim 14 wherein the inverting logic circuits comprise alternating delaying NOR-gates and delaying NAND-gates coupled in series with each other, and wherein the control logic gates comprise alternating control NOR-gates and control NAND-gates with the delaying NOR-gates receiving an output from a respective control NOR-gate and the delaying NAND-gates receiving an output from a control NAND-gate.

16. The computer system of claim 1 wherein the memory device comprises a dynamic random access memory.

17. The computer system of claim 16 wherein the dynamic random access memory comprises a synchronous dynamic random access memory.

* * * * *

UNITED STATES PATENT AND TRADEMARK OFFICE
CERTIFICATE OF CORRECTION

PATENT NO. : 6,759,883 B2
DATED : July 6, 2004
INVENTOR(S) : Tyler J. Gomm

It is certified that error appears in the above-identified patent and that said Letters Patent is hereby corrected as shown below:

Title page,
Item [56], References Cited, U.S. PATENT DOCUMENTS, please insert the following references:

| | | | |
|---|---|---|---|
| -- 4,255,790 | 3/1981 | Hondeghem | 364/487 |
| 5,336,939 | 8/1994 | Eitrheim et al. | 307/269 |
| 5,544,203 | 8/1996 | Casasanta et al. | 375/376 |
| 5,600,274 | 2/1997 | Houston | 327/262 |
| 5,844,954 | 12/1998 | Casasanta et al. | 375/373 |
| 6,087,868 | 7/2000 | Millar | 327/156 |
| 6,101,197 | 8/2000 | Keeth et al. | 370/517 |
| 6,173,424 B1 | 1/2001 | Voshell et al. | 714/718 |
| 6,175,928 B1 | 1/2001 | Liu et al. | 713/401 |
| 6,201,752 B1 | 3/2001 | Bui et al. | 365/226 |
| 6,317,381 B1 | 11/2001 | Gans et al. | 365/233 |
| 6,407,687 B2 | 6/2002 | Martin et al. | 341/122 |
| 6,417,713 B1 | 7/2002 | DeRyckere et al. | 327/271 |
| 6,446,226 B1 | 9/2002 | Voshell et al. | 714/718 |
| 6,449,727 B1 | 9/2002 | Toda | 713/401 |
| 6,486,723 B1 | 11/2002 | DeRyckere et al. | 327/271 |
| 6,518,800 B2 | 2/2003 | Martin et al. | 327/94 |
| 6,586,979 B2 | 7/2003 | Gomm et al. | 327/161 |
| 6,556,489 B2 | 4/2003 | Gomm et al. | 365/194 --. |

Reads, "6,069,506 A    *5/2000    Miller et al.    327/156" should read
-- 6,069,506 A  *5/2000    Miller, Jr., et al.    327/156 --.

Column 3,
Line 60, reads, "also causes the clock" should read -- also cause the clock --.

UNITED STATES PATENT AND TRADEMARK OFFICE
CERTIFICATE OF CORRECTION

PATENT NO. : 6,759,883 B2
DATED : July 6, 2004
INVENTOR(S) : Tyler J. Gomm

It is certified that error appears in the above-identified patent and that said Letters Patent is hereby corrected as shown below:

Column 7,
Line 7, reads, "As explained above, an" should read -- As explained above, a --.
Lines 40-47, reads, "Is shown in FIG. 8 in the context of a delay-locked loop, it will be understood it can be used in other types of locked-loops, such as phase-locked loops.
    Although the variable delay line 154, which may be the variable delay line 40, 50, 100, is shown in FIG. 8 in the context of a delay-locked loop, it will be understood it can be used in other types of locked-loops, such as phase-locked loops, as well as" should read -- Although the variable delay line 154, which may be the variable delay line 40, 50, 100, is shown in FIG. 8 in the context of a delay-locked loop, it will be understood it can be used in other types of locked-loops, such as phase-locked loops, as well as --.
Line 52, reads, "in FIG. 8 may be used the" should read -- in FIG. 8 may use the --.

Signed and Sealed this

Thirteenth Day of September, 2005

JON W. DUDAS
*Director of the United States Patent and Trademark Office*